United States Patent
Bollepalli et al.

(10) Patent No.: US 7,523,435 B2
(45) Date of Patent: Apr. 21, 2009

(54) PIXELATED MASKS FOR HIGH RESOLUTION PHOTOLITHOGRAPHY

(75) Inventors: Srinivas B. Bollepalli, Aloha, OR (US); Paul S. Davids, Portland, OR (US); Vivek Singh, Portland, OR (US)

(73) Assignee: Intel Corporation, Santa Clara CA ( * ) Notice: Subject to any disclaimer, the term of this patent is extended or adjusted under 35 U.S.C. 154(b) by 335 days.

(21) Appl. No.: 11/292,857

(22) Filed: Dec. 1, 2005

(65) Prior Publication Data

US 2007/0143732 A1    Jun. 21, 2007

(51) Int. Cl.
*G06F 17/50* (2006.01)
(52) U.S. Cl. .................................. 716/19
(58) Field of Classification Search ............. 716/19–21
See application file for complete search history.

(56) References Cited

U.S. PATENT DOCUMENTS

| | | | | |
|---|---|---|---|---|
| 5,917,332 A | * | 6/1999 | Chen et al. | 324/765 |
| 7,194,105 B2 | * | 3/2007 | Hersch et al. | 382/100 |
| 2005/0149902 A1 | * | 7/2005 | Shi et al. | 716/21 |
| 2007/0009808 A1 | * | 1/2007 | Abrams et al. | 430/5 |

OTHER PUBLICATIONS

U.S. Appl. No. 11/173,394, filed Jun. 30, 2005, Inventor: Bin Hu.

* cited by examiner

*Primary Examiner*—Jack Chiang
*Assistant Examiner*—Binh C Tat
(74) *Attorney, Agent, or Firm*—David L. Guglielmi

(57) ABSTRACT

Some embodiments of the present invention include apparatuses and methods relating to pixelated masks for high resolution photolithography.

8 Claims, 5 Drawing Sheets

PIXELATED MASKS FOR HIGH RESOLUTION PHOTOLITHOGRAPHY

TECHNICAL FIELD

Embodiments of the invention relate to photolithography technology. In particular, embodiments of the invention relate to pixelated masks for high resolution photolithography.

BACKGROUND

In semiconductor manufacturing, devices, such as transistors, may be produced on a semiconductor wafer and interconnected to form integrated circuits (ICs) that perform numerous useful functions. The ICs may be packaged and sold. Forming the devices typically includes numerous steps of photolithography that provide patterns on the wafer surface.

Photolithography typically includes forming a photosensitive film on a wafer, exposing the film with a pattern by projecting radiation through a mask to chemically alter the film, and developing away exposed or unexposed portions of the film so a patterned film remains on the wafer.

Typically, masks may be designed using the characteristics of the photolithography equipment, including the optics and illumination source, and the desired pattern. Often, the photolithography equipment is designed to enhance resolution, such that small features may be patterned. Resolution, R, may be defined as the smallest obtainable half pitch and may given by:

$$R = k1\left(\frac{\lambda}{NA}\right),$$

where $\lambda$ is the radiation wavelength, NA is the numerical aperture of the optics, and k1 is a constant based on the photolithography system (including the equipment, the photoresist, and the mask). NA relates to the angular aperture, $\alpha$, of the lens (the angle between a line from the focal point to the center of the lens and a line from the focal point to the aperture) and is given by:

$$NA = I\sin\left(\frac{a}{2}\right),$$

where I is the refractive index of the medium the optics are in (typically air, such that I is 1.0).

Although a low k1 is desired to improve resolution, as k1 is pushed lower, it may become difficult to design masks. Therefore, mask designs may be restricted by design rules, based on the photolithography system, that hinder production of a desired pattern. In particular, photolithography tool resolutions of about k1 equal to 0.33 may provide severe design rule restrictions.

Further, after designing a mask, it may be determined that the mask is not manufacturable and the pattern may have to be abandoned and replaced. Such abandonment and replacement can increase the cost and time of producing the masks.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, apparatuses and methods relating to photolithography masks are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Figure 1:
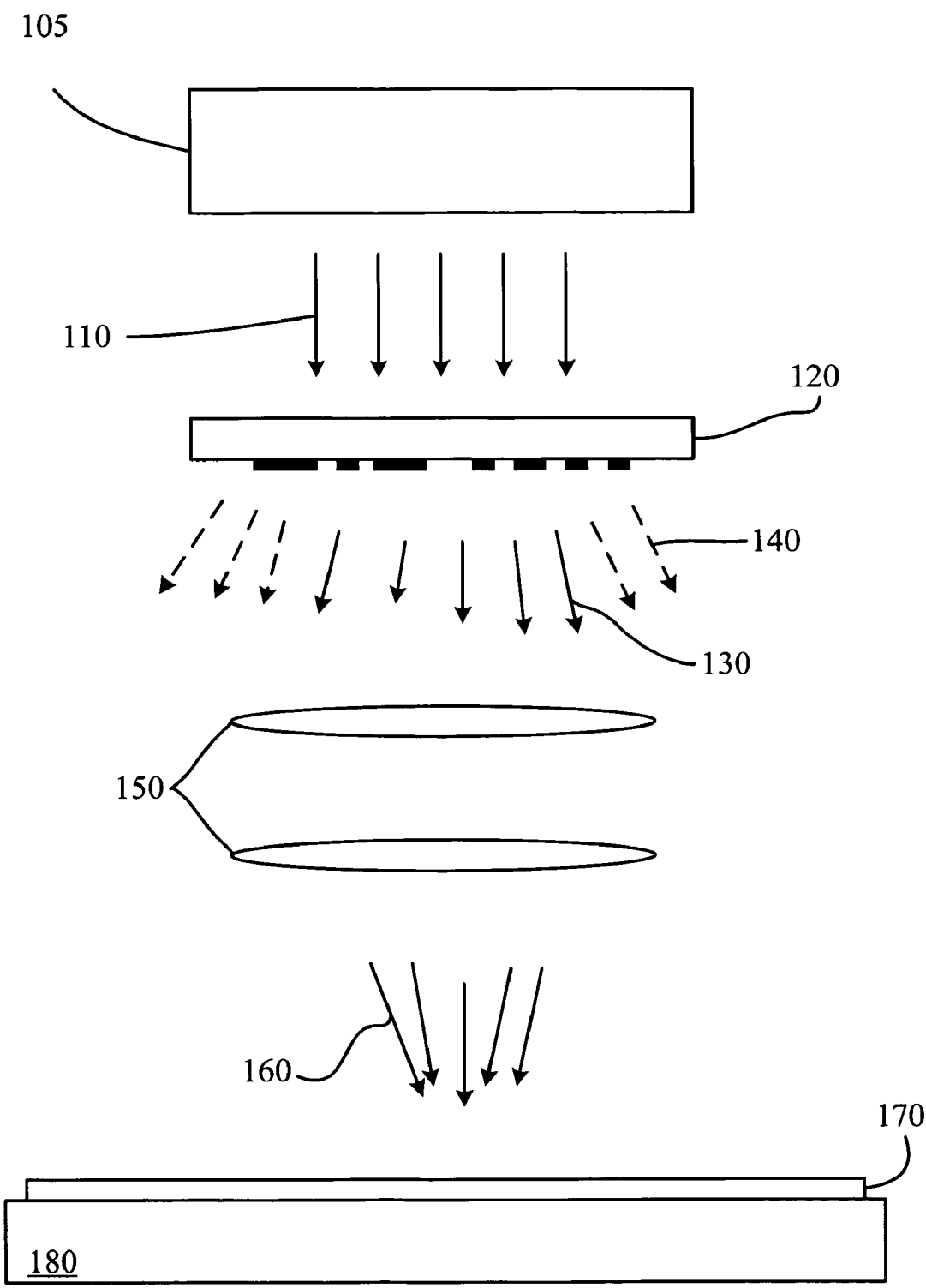
FIG. 1 illustrates a photolithography apparatus.

As illustrated in FIG. 1, in a photolithography system or tool, illumination source and illumination optics 105 may provide an irradiation 110. In an embodiment, illumination source and illumination optics 105 may include a laser. Irradiation 110 may be of any wavelength and may be generated by any suitable technique. As shown, mask/reticle 120 may be illuminated by irradiation 110. In an embodiment, mask/reticle 120 may include information to form a desired pattern.

Irradiation 110 may pass through mask/reticle 120 to form scattered radiation 130, 140. Scattered radiation 130 may be captured by projection optics 150 while scattered radiation 140 may not be captured by projection optics 150. After passing through projection optics 150, scattered radiation 130 may form image radiation 160. Image radiation 160 may include a portion of the information of mask/reticle 120 and may be projected onto a resist layer 170 deposited on a substrate 180. Image radiation 160 may chemically alter resist layer 170 such that it is may be developed to form a pattern.

The photolithography system discussed may have numerous characteristics including a radiation wavelength ($\lambda$), numerical aperture (NA), and a k1 value related to a minimum desired half pitch, l, such that $$k1 = \left(\frac{l}{2}\right)\left(\frac{NA}{\lambda}\right).$$

NA relates to the angular aperture, $\alpha$, of the lens (the angle between a line from the focal point to the center of the lens and a line from the focal point to the aperture) and is given by:

$$NA = I\sin\left(\frac{a}{2}\right),$$

where I is the refractive index of the medium the optics are in (typically air, such that I is 1.0).

Mask/reticle 120 may be designed based on the photolithography system and a desired pattern. In designing photolithography masks, such as mask/reticle 120, it may be advantageous to design masks with fewer design rule restrictions. In particular, at photolithography tool resolutions of k1 equal to about 0.33, designing masks with fewer design rule restrictions may result in higher resolution patterning and better performing circuits. Further, it may be advantageous to design alternative mask solutions for a desired pattern and evaluate each design for manufacturability. Briefly, embodiments of the present invention may include designing pixelated masks that allow mask design with optimal resolution and with fewer design rule restrictions, and alternative mask solutions for a desired pattern that can be evaluated for manufacturability.

Figure 2:
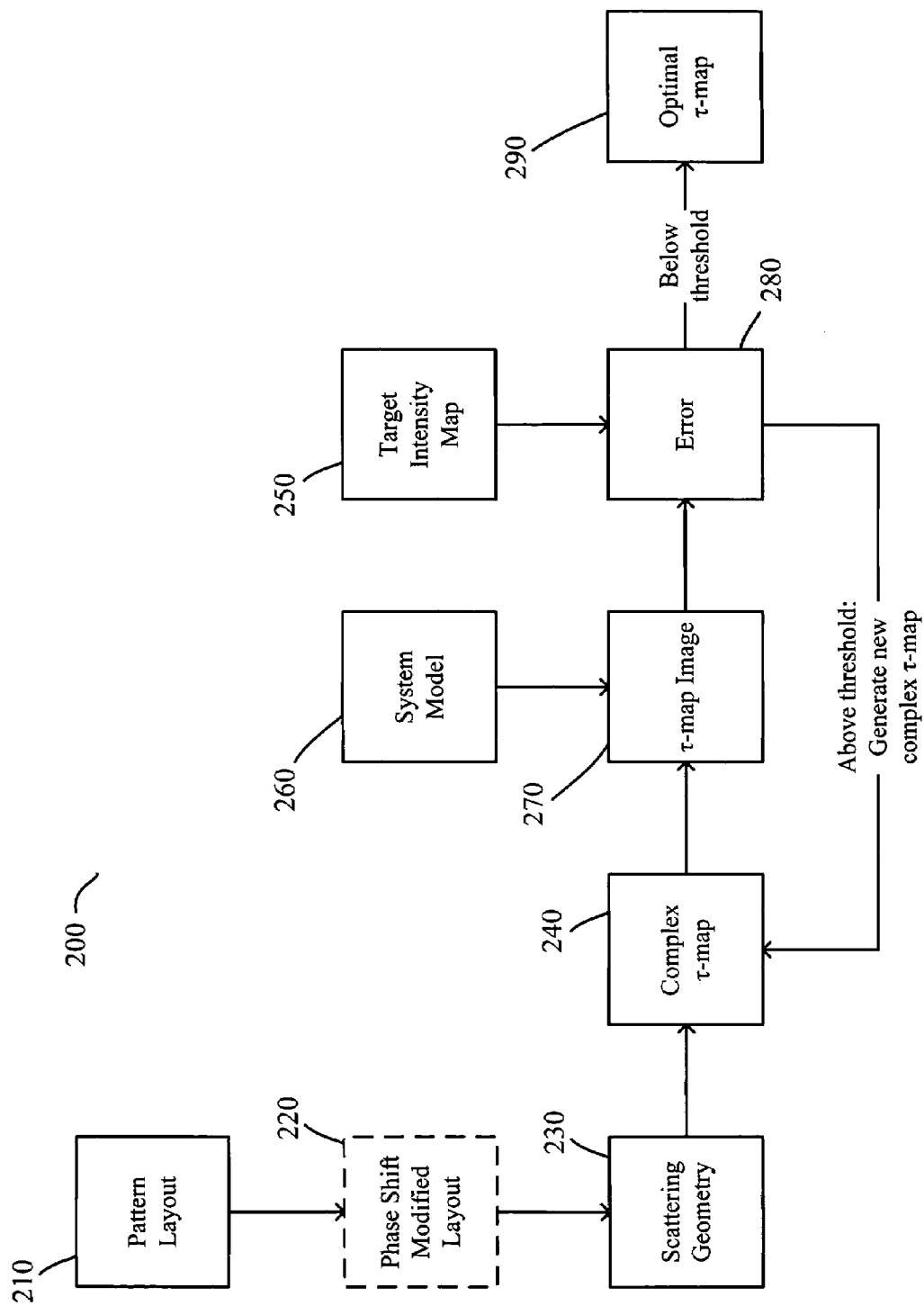
FIG. 2 illustrates a flow chart of a method for forming an optimal τ-map.
Figure 3:
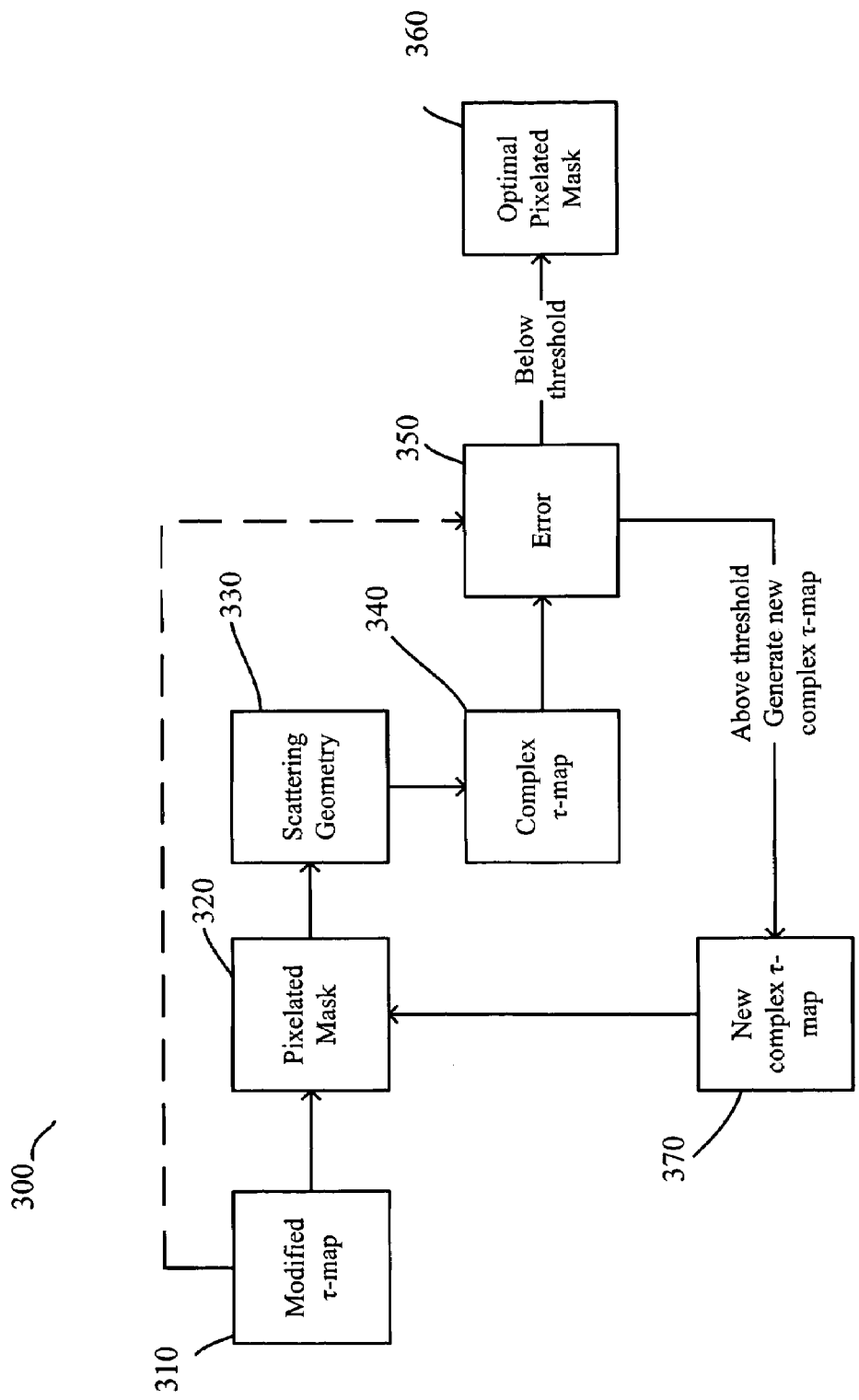
FIG. 3 illustrates a flow chart of a method for forming an optimal pixelated mask.
Figure 4:
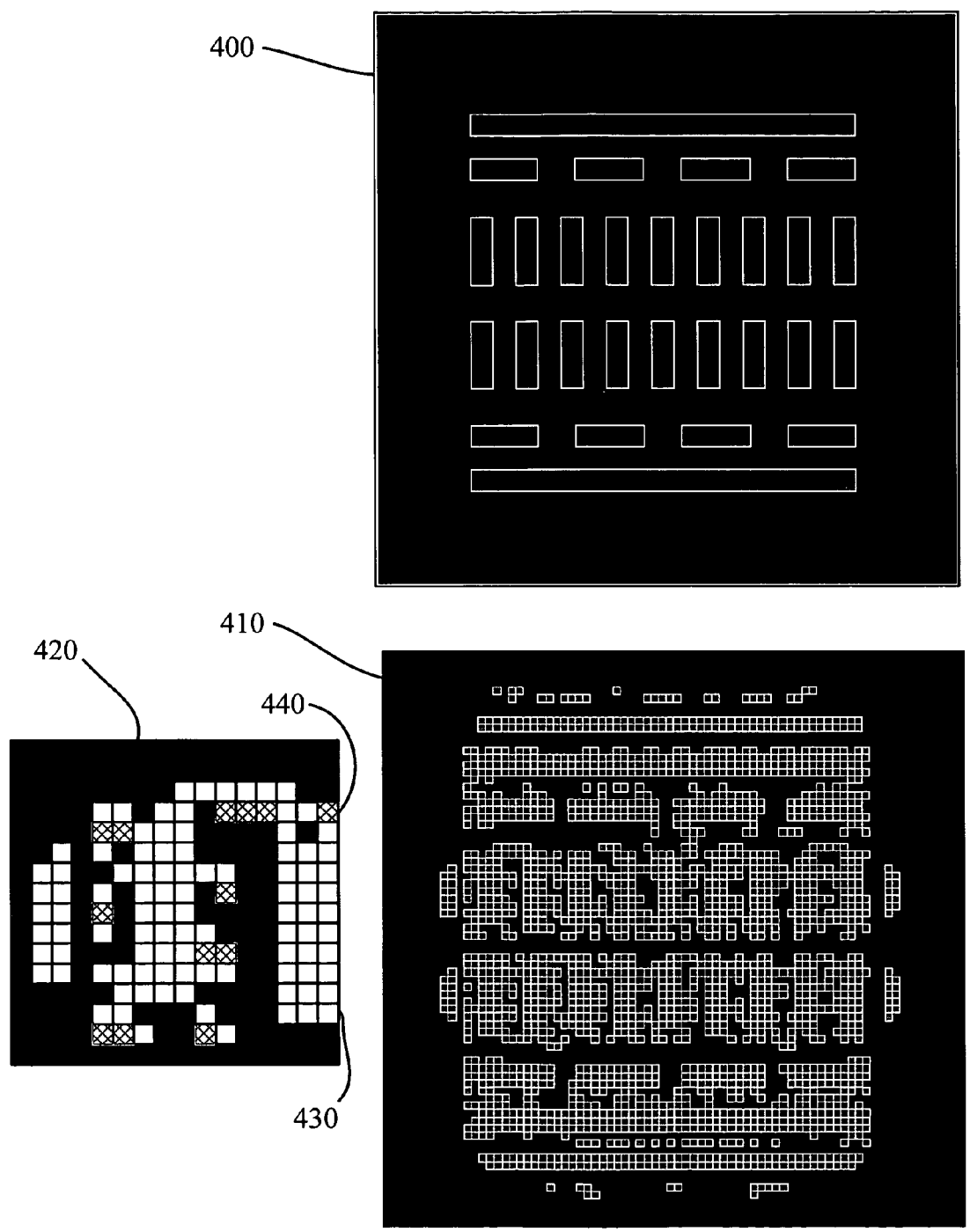
FIG. 4 illustrates a pixelated mask.

FIG. 2 illustrates an embodiment of a method 200 that may provide an optimal transmission map or τ-map. FIG. 3 illustrates an embodiment of a method 300 that may provide an optimal pixelated mask. FIG. 4 illustrates an example of a pixelated mask 410 formed from a desired pattern 400.

FIG. 4 also illustrates a close-up 420 of a portion of pixelated mask 410 that includes opaque pixels 420, transmissive pixels 430, and phase-shifted transmissive pixels 440. In FIG. 4, the lines shown between represented pixels are for illustration purposes only and may not be included in pixelated mask 410. Desired pattern 400 may include any pattern of any size, shape, or complexity, and may include any number and variety of elements, such as lines, spaces, holes, and any other shape subject to physical constraints set by the optical system and radiation. As is further discussed below, pixelated mask 410 may be formed from desired pattern 400, however, any number of other pixelated masks may also be formed from desired pattern 400.

As illustrated in FIG. 2, method 200 may operate on a pattern layout 210. Pattern layout 210 may include information in any suitable format that represents a pattern. In an embodiment, pattern layout 210 may include information for a mask pattern. In another embodiment, pattern layout 210 may include information that represents a mask pattern corresponding to a pattern to be formed on a semiconductor wafer. In another embodiment, pattern layout 210 may include information for a mask initial condition. In an embodiment, pattern layout 210 may include polygons that represent transmissive (clear) and absorptive (opaque) regions of a mask.

In another embodiment, pattern layout 210 may include a database or matrix that represents transmissive and absorptive regions of a mask pattern. In an embodiment, pattern layout 210 may include a database or matrix of zeros and ones that represent transmissive and absorptive regions of a desired pattern or geometry. In an embodiment, transmissive regions may be represented by ones and absorptive regions may be represented by zeros.

Pattern layout 210 may be modified to form a phase shift modified layout 220. Forming phase shift modified layout 220 may include any change to pattern layout 210 that applies a phase shift to transmissive portions of pattern layout 210. Phase shift modified layout 220 may include any number of different phase shifts of any phase shift values. In an embodiment, phase shift modified layout 220 may include 180 degree phase shifts to transmissive portions of pattern layout 210. In another embodiment, phase shift modified layout 220 may include 60 degree phase shifts to transmissive portions of pattern layout 210. In another embodiment, phase shift modified layout 220 may include 180 degree phase shifts and 90 degree phase shifts to transmissive portions of pattern layout 210.

As discussed, phase shift modified layout 220 may include adding a 180 degree phase shift to portions of the clear regions of pattern layout 210. In an embodiment, phase shift modified layout 220 may add a 180 degree phase shift by changing a database or matrix of pattern layout 210 from a matrix having ones and zeros to a matrix having ones, zeros, and negative ones. In an embodiment, absorptive regions may be represented by zeros, transmissive regions having no phase shift may be represented by ones, and transmissive regions having a 180 degree phase shift may be represented by negative ones. In some embodiments, phase shift modified layout 220 may not be performed.

Pattern layout 210 or phase shift modified layout 220 may be used to form a scattering geometry 230. Forming scattering geometry 230 may include any modification or calculation that models radiation scattered by pattern layout 210 or phase shift modified layout 220. With reference to FIG. 1, scattering geometry 230 may be a model of scattered radiation 130, 140. In an embodiment, forming scattering geometry 230 may include solving Maxwell's equation for electromagnetic energy. In an embodiment, a Maxwell's equation solver may be used to form scattering geometry 230.

Scattering geometry 230 may be used to form a complex τ-map 240. Complex τ-map 240 may include any information that represents the part of scattered radiation that is captured by a photolithography optics system and may be formed by any suitable technique. Complex τ-map 240 may therefore be more generally referred to as a map, a transmission map, or a τ-map.

In an embodiment, forming complex τ-map 240 may include a modification or calculation that convolves scattered radiation with a sinc function. In an embodiment, forming complex τ-map 240 may include a modification or calculation that convolves scattered radiation with a sinc function of the form:

$$\left(\frac{\sin(\pi L x)}{(\pi L x)}\right).$$

With reference to FIG. 1, forming complex τ-map 240 may depend on projection optics 150 and illumination source and illumination optics 105. In an embodiment, forming complex τ-map 240 may include filtering scattered radiation 130, 140 such that only scattered radiation 130 is taken into account. In an embodiment, complex τ-map 240 may include a matrix or database of complex numbers.

Method 200 may utilize a system model 260. System model 260 may include any suitable information that describes a projection optics system, an illumination source, and an illumination optics system. With respect to FIG. 1, system model 260 may describe illumination source and illumination optics 105 and projection optics 150. In an embodiment, system model 260 may represent a partially coherent optical system. In an embodiment, system model 260 may include a matrix. In an embodiment, system model 260 may include a matrix designated by the symbol K, as is used in equations below.

Method 200 may utilize a target intensity map 250. Target intensity map 250 may include any suitable information that represents a desired pattern to be formed in a photoresist. In an embodiment, target intensity map 250 may include a matrix or database having numbers between zero and one, inclusive, where zero represents no photoresist and one represents full photoresist thickness. In an embodiment, target intensity map 250 may be formed by taking an unattainable photoresist pattern, such as an ideal pattern having perfectly sharp corners (in an embodiment, a matrix of only ones and zeros), and modifying the unattainable pattern to approximate a physically attainable pattern. In an embodiment, forming target intensity map 250 may include taking an ideal pattern having ones and zeros and modifying the ideal pattern to approximate edge imperfections using numbers between zero and one.

In an embodiment, forming target intensity map 250 may include taking into account the Nyquist Sampling Theory, which defines a limit resolution based on any given wavelength. With reference to FIG. 1, in an embodiment, forming target intensity map 250 may depend on projection optics 150. In an embodiment, target intensity map 250 may include a matrix. In an embodiment, target intensity map 250 may include a matrix designated by the symbol T, as is used in the equations below.

As shown in FIG. 2, complex τ-map 240, target intensity map 250, and system model 260 may be used to form optimal τ-map 290. The term optimal in reference optimal τ-map 290 to is used only in the sense that optimal τ-map 290 has been optimized with respect to error 280, as is further discussed below. Of course, the optimal τ-map (or any τ-map) may be further optimized using the methods discussed. Optimal τ-map 290 may therefore be generally referred to as an improved τ-map, an intermediate τ-map, or as a τ-map. More generally, the term optimal is used throughout the specification only in the limited sense that indicates meeting a threshold requirement.

In an embodiment, the following iterative method may be used to form optimal τ-map 290: (a) forming τ-map image 270 from complex τ-map 240 and system model 260, (b) calculating an error 280, (c) comparing error 280 to a threshold level, and (d) if error 280 is below the threshold level, stopping the iteration or, if error 280 is above the threshold level, forming a new complex τ-map.

In an embodiment, the iterative method may be repeated until error 280 is below a chosen threshold level. In another embodiment, method (a)-(c) may be used only once to form optimal τ-map 290. In an embodiment, the method discussed immediately below, either iteratively or singularly, may be used to determine optimal τ-map 290.

A matrix, I, representing τ-map image 270 may be formed by the following technique. At any coordinate (i,j), the image-level intensity I based on complex τ-map 240 may be determined by:

$$I_{ij} = \vec{x}_{ij}^T K \vec{x}_{ij} \quad i=1,2,\ldots,N \; j=1,2,\ldots,N \quad (1)$$

where $\vec{x}$ may be a vector of selected τ-values around the pixel coordinate (i, j) of interest and K may be a matrix of system model 260, as discussed above. The number of τ-values around pixel coordinate $\vec{x}$ may be determined by the simulation size and the optical system. In an embodiment, $\vec{x}$ may include about 15 by 15 τ-values around the pixel coordinate. In another embodiment, $\vec{x}$ may include about 10 by 10 τ-values around the pixel coordinate. In another embodiment, $\vec{x}$ may include about 12 by 12 τ-values around the pixel coordinate.

Given τ-map image 270, represented by matrix I, and target intensity map 250, represented by matrix T, error 280 may be determined by taking the difference between I and T. In an embodiment, if error 280 is below a threshold level, complex τ-map 240 may be optimal τ-map 290 and if error 280 is above the threshold level, method 200 may continue as is discussed immediately below to determine a new complex τ-map. The threshold error level may be any chosen value.

Given target intensity map 250, matrix T, a suitable vector of τ* values may be determined to approximately reproduce T. In order to determine τ* values, τ* may be treated as a perturbation around τ, such that:

$$\tau^* = \tau + \Delta\tau \quad (2)$$

which may give the vector:

$$\vec{x}^* = \vec{x} + \Delta\vec{x} \quad (3)$$

which may be substituted into equation (1) to give:

$$T_{ij} = \vec{x}_{ij}^T K \vec{x}_{ij} + \Delta\vec{x}_{ij}^T K \vec{x}_{ij} + \vec{x}_{ij}^T K \Delta\vec{x}_{ij} + \Delta\vec{x}_{ij}^T K \Delta\vec{x}_{ij} \quad (4)$$

In an embodiment, equation (4) may be a representation of target intensity map 250.

Error 280 may be the difference between T and I, and may be designated δ. δ may be given by:

$$\delta_{ij} = T_{ij} - I_{ij} \quad (5)$$

which, by substituting equations (1) and (4) may be written:

$$\delta_{ij} = \Delta\vec{x}_{ij}^T K \Delta\vec{x}_{ij} + 2\Delta\vec{x}_{ij}^T K \vec{x}_{ij} \quad (6)$$

Optimal τ-map 290 may be approximated by determining an approximate solution to equation (6). In order to solve that problem, the inventors have developed a method that they have termed a method of proportional quadratics. The method of proportional quadratics may include any suitable method that solves for the perturbation introduced in equation (3).

In an embodiment, the method of proportional quadratics may include any or all of the following: diagonalizing the system model matrix using the eigen-values and eigen-vectors of the system model matrix; defining a new vector and a new perturbation using the eigen-vectors of the system model matrix and the τ-value vector; re-writing delta (δ) based on the diagonalized system model matrix and the new vector and new perturbation; expanding delta into independent quadratic equations; solving for the new perturbation; and solving for the perturbation using an inverse transformation of the second perturbation using the eigen-vectors of the system model matrix.

In an embodiment, the method of proportional quadratics may include all or portions of the following method. The K matrix may be diagonalized as:

$$K = V \Lambda V' \quad (7)$$

where V contains the eigen-vectors of K and Λ contains the eigen-values along the principle diagonal. Also, a new vector may be defined:

$$\vec{y}_{ij} = V' \vec{x}_{ij} \quad (8)$$

Equation (6) may then be rewritten:

$$\delta_{ij} = \Delta\vec{y}_{ij}^T \Lambda \Delta\vec{y}_{ij} + 2\Delta\vec{y}_{ij}^T \Lambda \vec{y}_{ij} \quad (9)$$

which may be expanded to give:

$$\delta_{ij} = \sum_{k=1}^{J} \lambda_k \Delta y_{ij,k}^2 + \sum_{k=1}^{J} \lambda_k \Delta y_{ij,k} y_{ij,k} \quad (10)$$

which, using the following identity:

$$\delta_{ij} = \frac{\lambda_1 \delta_{ij}}{\sum\limits_{k=1}^{J} \lambda_k} + \frac{\lambda_2 \delta_{ij}}{\sum\limits_{k=1}^{J} \lambda_k} + \ldots + \frac{\lambda_J \delta_{ij}}{\sum\limits_{k=1}^{J} \lambda_k} \quad (11)$$

may give:

$$\sum_{k=1}^{J} \lambda_k \left( \Delta y_{ij,k}^2 + 2\Delta y_{ij,k} y_{ij,k} - \frac{\delta_{ij}}{\sum\limits_{m=1}^{J} \lambda_m} \right) = 0 \quad (12)$$

Equation (12) may provide J independent quadratic equations which can be solved for $\Delta y_{ij}$, and $\Delta x_{ij}$ may be obtained by an inverse transformation of the form:

$$\Delta \vec{x}_{ij} = V \Delta \vec{y}_{ij} \quad (13)$$

Given $\Delta x_{ij}$, a new τ-map may be determined. In an embodiment, the new intermediate τ-map may replace complex τ-map 240 and the iterative method illustrated in FIG. 2 may be repeated as needed to form optimal τ-map 290.

In an embodiment, optimal τ-map 290 may include a locally optimal solution that is dependent on the initial condition of pattern layout 210. In another embodiment, optimal τ-map 290 may include a non-local solution independent of the initial condition of pattern layout 210.

FIG. 3 illustrates a method 300 that may provide an optimal pixelated mask 360.

Method 300 may include an iterative method to generate optimal pixelated mask 360. Again, the term optimal is used only in the sense that optimal pixelated mask 360 has been optimized with respect to error 350, as is further discussed below. Of course, the optimal pixelated mask (or any pixelated mask) may be further optimized using the methods discussed. Optimal pixelated mask 360 may therefore be generally referred to as an improved pixelated mask, an intermediate pixelated mask, or as a pixelated mask. In an embodiment, the iterative method may include (a) forming a pixelated mask from a τ-map, (b) generating a scattering geometry from the pixelated mask, (c) generating a complex τ-map from the scattering geometry, (d) comparing the generated complex τ-map to an optimal τ-map to generate an error, (e) comparing the error to a desired threshold level, and (f) if, the error is below the threshold level, accepting the pixelated mask as an optimal pixelated mask, or, if the error is above the threshold level, generating a new τ-map, and repeating another iteration of (a)-(f). In another embodiment, the method of (a)-(f) may only be performed once to obtain an optimal pixelated mask.

As illustrated in FIG. 3, method 300 may include an optimal τ-map 310. Optimal τ-map 310 may include any τ-map as discussed above. In an embodiment, optimal τ-map 310 may be an optimal τ-map obtained from method 200. In another embodiment, optimal τ-map 310 may include any target τ-map.

Optimal τ-map 310 (or new complex τ-map 370, if on a later iteration) may be used to form a pixelated mask 320. Pixelated mask 320 may include any information that represents a mask and may be formed by any suitable technique. In an embodiment, pixelated mask 320 may be a matrix or database of numbers representing opaque, transmissive, and, optionally, phase-shifted portions of a mask. In another embodiment, pixelated mask 320 may be a matrix of numbers representing opaque, transmissive, and phase-shifted portions of a mask. In an embodiment, pixelated mask 320 may be a matrix of ones and zeros. In another embodiment, pixelated mask 320 may be a matrix of ones, zeros, and negative ones.

In an embodiment, pixelated mask 320 may be formed by a dithering step. In an embodiment, pixelated mask 320 may be formed by rounding the values of optimal τ-map 310 to discrete values representing opaque, transmissive, and any number of phase shifted transmissive portions. As is discussed further in reference to FIG. 5, any number of different pixelated masks may be formed by the dithering or rounding of optimal τ-map 310 based on a chosen mask initial condition. In another embodiment, pixelated mask 320 may be formed by rounding the values of optimal τ-map 310 to numbers representing opaque, transmissive, and, optionally, phase-shifted portions of a mask.

Pixelated mask 320 may be used to form a scattering geometry 330. Forming scattering geometry 330 may include any modification or calculation that models radiation scattered by pixelated mask 320. With reference to FIG. 1, scattering geometry 330 may be a model of scattered radiation 130, 140. In an embodiment, forming scattering geometry 330 may include solving Maxwell's equation for electromagnetic energy. In an embodiment, a Maxwell's equation solver may be used to form scattering geometry 330.

Scattering geometry 330 may be used to form a complex τ-map 340. Complex τ-map 340 may include any information that represents the part of scattered radiation that is captured by a photolithography optics system and may be formed by any suitable technique. In an embodiment, forming complex τ-map 340 may include a modification or calculation that convolves scattered radiation with a sinc function. In an embodiment, forming complex τ-map 340 may include a modification or calculation that convolves scattered radiation with a sinc function of the form:

$$\left( \frac{\sin(\pi L x)}{(\pi L x)} \right).$$

With reference to FIG. 1, forming complex τ-map 340 may depend on projection optics 150 and illumination source and illumination optics 105. In an embodiment, forming complex τ-map 340 may include filtering scattered radiation 130, 140 such that only scattered radiation 130 is taken into account. In an embodiment, complex τ-map 340 may include a matrix or database of complex numbers.

As shown in FIG. 3, complex τ-map 340 may be compared to optimal τ-map 310 to generate error 350. In an embodiment, error 350 may be compared to a threshold error to determine whether pixelated mask 320 is an optimal pixelated mask. If error 350 is below the threshold, optimal pixelated mask 360 may be pixelated mask 320. If error 350 is above the threshold, another iteration may be performed, as discussed above, to form an optimal pixelated mask. The error threshold may be any chosen value.

If error 350 is above the threshold, new complex τ-map 370 may be formed. New complex τ-map 370 may include any information that represents the part of scattered radiation that is captured by a photolithography optics system and may be formed by any suitable technique. In an embodiment, new complex τ-map 370 may be formed by altering the τ-map used to form pixelated mask 320 (in a first iteration, optimal τ-map 310, in subsequent iterations, if needed, the prior new complex τ-map). In an embodiment, new complex τ-map 370 may be formed by adding error 350 to a prior complex τ-map. In an embodiment, new complex τ-map 370 may be formed by adding information lost in going from scattering geometry 330 to complex τ-map 340 (with reference to FIG. 1, the lost information may include scattered radiation 140) to a prior complex τ-map. In another embodiment, complex τ-map 370 may be formed by adding error 350 and information lost in going from scattering geometry 330 to complex τ-map 340 to a prior complex τ-map.

As discussed above, new complex τ-map 370 may used to form a new pixelated mask and the discussed iterative method may be repeated until an optimal pixelated mask 360 is determined.

Figure 5:
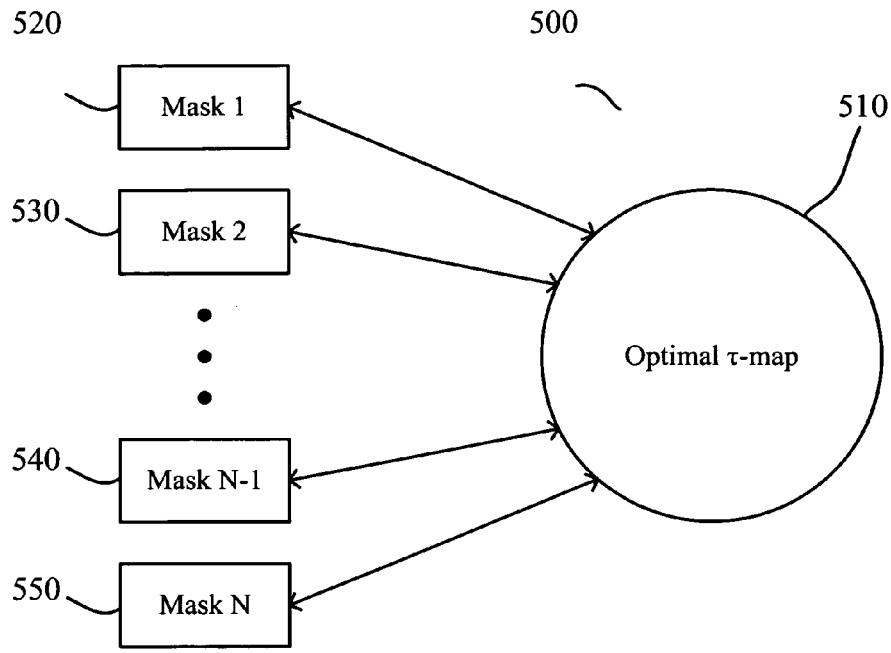
FIG. 5 illustrates a diagram of a method for forming any number of pixelated masks.

FIG. 5 illustrates a method 500 that may provide for designing any number of mask solutions based on an optimal τ-map in accordance with an embodiment of the present invention.

Method 500 includes an optimal τ-map 510 and masks 520, 530, 540, 550. Optimal τ-map 510 may include any τ-map as discussed above. In an embodiment, optimal τ-map 510 may include a τ-map formed by the method of FIG. 2. As illustrated in FIG. 5, any number of masks may be formed using optimal τ-map 510 and the method of FIG. 3.

With reference to FIG. 3, in going from optimal τ-map 310 to pixelated mask 320, any variety of mask initial conditions may be chosen. In choosing a mask initial condition from the unlimited number of options, method 300 may be used to determine an optimal pixelated mask having the same mask condition as the mask initial condition. In an embodiment, a binary mask condition may be used. In another embodiment, a phase-shift mask condition may be used. In an embodiment, a mask condition including a 0 degree phase shift, a 60 degree phase shift and a 120 degree phase shift may be used. In another embodiment, a condition may be chosen based on user input.

In an embodiment, a variety of optimal pixelated masks derived from each chosen mask initial condition may be compared based on manufacturability, cost, and ease of fabrication in order to select a pixelated mask to be manufactured.

In some embodiment, the techniques of FIGS. 3, 4 and 5, or portions of the techniques of FIGS. 3, 4, and 5 (e.g., the method of proportional quadratics) may be implemented as sequences of instructions executed by an electronic system. The sequences of instructions can be stored by the electronic device or the instructions can be received by the electronic device (e.g., via a network connection).

Figure 6:
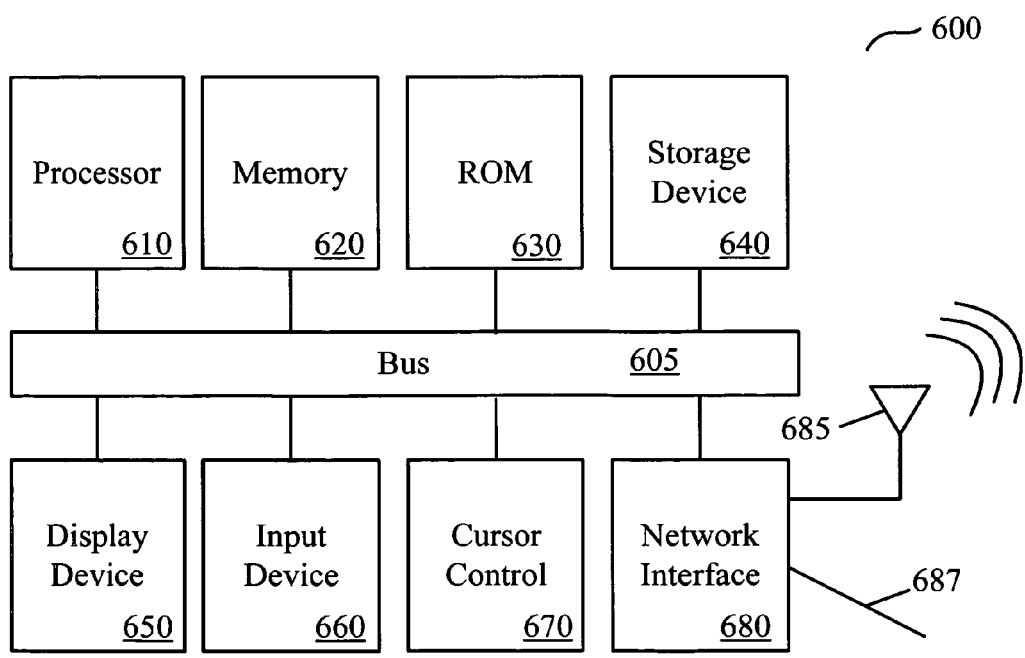
FIG. 6 illustrates a diagram of an electronic system.

FIG. 6 is a block diagram of one embodiment of an electronic system. The electronic system illustrated in FIG. 6 is intended to represent a range of electronic systems, for example, computer systems, network access devices, etc. Alternative systems, whether electronic or non-electronic, can include more, fewer, or different components.

Electronic system 600 includes bus 605 or other communication device to communicate information, and processor 610 coupled to bus 605 to process information. While electronic system 600 is illustrated with a single processor, electronic system 600 can include multiple processors or co-processors. Electronic system 600 further includes random access memory (RAM) or other dynamic storage device 620 (referred to as memory), coupled to bus 605 to store information and instructions to be executed by processor 610. Memory 620 also can be used to store temporary variables or other intermediate information during execution of instructions by processor 610.

Electronic system 600 also includes read only memory (ROM) and/or other static storage device 630 coupled to bus 605 to store static information and instructions for processor 610. Data storage device 640 is coupled to bus 605 to store information and instructions. Data storage device 640 such as a magnetic disk or optical disc and corresponding drive can be coupled to electronic system 600.

Electronic system 600 can also be coupled via bus 605 to display device 650, such as a cathode ray tube (CRT) or liquid crystal display (LCD), to display information to a user. Input device 660, including alphanumeric and other keys, is typically coupled to bus 605 to communicate information and command selections to processor 610. Another type of user input device is cursor control 670, such as a mouse, a trackball, or cursor direction keys to communicate direction information and command selections to processor 610 and to control cursor movement on display 650. Electronic system 600 further includes a network interface 680, such as a wired network interface 687 or a wireless network interface 685 to provide access to a network, such as a local area network.

Instructions are provided to memory from a storage device, such as magnetic disk, a read-only memory (ROM) integrated circuit, CD-ROM, DVD, via a remote connection (e.g., over a wired or wireless network via network interface) providing access to one or more electronically-accessible media, etc. In alternative embodiments, hard-wired circuitry can be used in place of or in combination with software instructions. Thus, execution of sequences of instructions is not limited to any specific combination of hardware circuitry and software instructions.

An electronically-accessible medium includes any mechanism that provides (i.e., stores and/or transmits) content (e.g., computer executable instructions) in a form readable by an electronic device (e.g., a computer, a personal digital assistant, a cellular telephone). For example, a machine-accessible medium may include read only memory (ROM), random access memory (RAM), magnetic disk storage media; optical storage media; flash memory devices, electrical, optical, acoustical or other form of propagated signals (e.g., carrier waves, infrared signals, digital signals), etc.

Methods and apparatuses are described herein with respect to integrated circuit manufacturing; however, the techniques described can be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method for forming a map comprising:
  forming a first map from a pattern layout;
  determining a map image matrix from the first map and a photolithography system model matrix;
  comparing the map image matrix to a target intensity matrix to determine an error;
  determining whether the error is below a threshold error;
  adding a perturbation to the first map to form a second map, wherein the perturbation is solved for using a method of proportional quadratics;
  Manufacturing a physical pixelated mask from the second map, wherein the physical pixelated mask includes a matrix of numbers representing opaque, transmissive and phase-shifted portions of a mask, and
  wherein the map comprises a $\tau$-map, the first map comprises a first $\tau$-map, the map image matrix comprises a $\tau$-map image matrix, and the second map comprises a second $\tau$-map;
  determining a second $\tau$-map image matrix from the second $\tau$-map and the photolithography system model matrix; and
  comparing the second $\tau$-map image matrix to the target intensity matrix to determine a second error.

2. The method of claim 1, wherein forming the first $\tau$-map comprises determining a scattering geometry from the pattern layout and filtering a scattered radiation resulting from illumination of the scattering geometry.

3. The method of claim 1, wherein forming the first $\tau$-map comprises altering the pattern layout with a phase shift modification.

4. The method of claim 1, wherein determining the $\tau$-map image matrix comprises determining an image level intensity for a coordinate by multiplying a transpose of a vector of $\tau$-values from the first $\tau$-map, the photolithography system model matrix, and the vector of $\tau$-values.

5. The method of claim 4, wherein the vector of $\tau$-values comprises about 15 by 15 $\tau$-values around the coordinate.

6. The method of claim 5, wherein the method of proportional quadratics comprises:
  defining a delta as the difference between the $\tau$-map image matrix and a representation of the target intensity matrix determined from the photolithography system model matrix and the vector of $\tau$-values plus the perturbation;
  forming a diagonalization of the photolithography system model matrix including the eigen-vectors and eigen-values of the photolithography system model matrix;
  expanding the delta into at least one independent quadratic equation based on the diagonalization and a second vector and a second perturbation;
  solving for the second perturbation; and
  determining the perturbation by an inverse transformation of the second perturbation.

7. The method of claim 6, wherein the second vector and the second perturbation are determined from the eigen-vectors of the photolithography system model matrix and the vector of $\tau$-values.

8. The method of claim 1, further comprising:
  determining whether the second error is below the threshold error; and
  adding a second perturbation to the second $\tau$-map to form a third $\tau$-map, wherein the second perturbation is solved for using the method of proportional quadratics.

* * * * *